United States Patent
Burghartz et al.

(10) Patent No.: US 7,951,691 B2
(45) Date of Patent: May 31, 2011

(54) METHOD FOR PRODUCING A THIN SEMICONDUCTOR CHIP COMPRISING AN INTEGRATED CIRCUIT

(75) Inventors: Joachim N. Burghartz, Leinfelden-Echterdingen (DE); Martin Zimmermann, Stuttgart (DE); Wolfgang Appel, Schwieberdingen (DE)

(73) Assignee: Institut fuer Mikroelektronik Stuttgart, Stuttgart (DE)

( * ) Notice: Subject to any disclaimer, the term of this patent is extended or adjusted under 35 U.S.C. 154(b) by 0 days.

(21) Appl. No.: 12/208,514

(22) Filed: Sep. 11, 2008

(65) Prior Publication Data

US 2009/0096089 A1    Apr. 16, 2009

Related U.S. Application Data

(63) Continuation of application No. PCT/EP2007/001886, filed on Mar. 6, 2007.

(30) Foreign Application Priority Data

Mar. 14, 2006  (DE) .................. 10 2006 013 419
Dec. 8, 2006  (DE) .................. 10 2006 059 394

(51) Int. Cl.
    *H01L 21/00*  (2006.01)
(52) U.S. Cl. ............... 438/462; 438/705; 257/E21.287; 257/E21.57
(58) Field of Classification Search .......... 438/455, 438/458, FOR. 106, FOR. 108, FOR. 231, 438/460, 462, 705, FOR. 408; 257/E21.287, 257/E21.568, E21.57
See application file for complete search history.

(56) References Cited

U.S. PATENT DOCUMENTS

| | | | |
|---|---|---|---|
| 6,165,813 A | 12/2000 | Quinn et al. | |
| 6,285,072 B1 | 9/2001 | Maeda | |
| 6,342,433 B1* | 1/2002 | Ohmi et al. | 438/455 |
| 6,521,068 B1 | 2/2003 | Menschig et al. | |
| 6,566,235 B2* | 5/2003 | Nishida et al. | 438/458 |
| 6,774,010 B2 | 8/2004 | Chu et al. | |
| 6,825,057 B1 | 11/2004 | Heyers et al. | |
| 6,972,215 B2* | 12/2005 | Sakaguchi et al. | 438/113 |
| 2001/0014516 A1* | 8/2001 | Shimoji | 438/458 |
| 2002/0146893 A1* | 10/2002 | Shimoda et al. | 438/458 |

(Continued)

FOREIGN PATENT DOCUMENTS

| | | |
|---|---|---|
| DE | 40 29 973 A1 | 3/1992 |
| DE | 197 52 208 A1 | 6/1999 |
| DE | 100 19 705 A1 | 5/2001 |
| FR | 2 823 596 | 10/2002 |

(Continued)

OTHER PUBLICATIONS

Imai et al, "Crystalline Quality of Silicon Layer Formed by FIPOS Technology", 1983, Journal of Crystal Growth 63(1983), 547-553.*

(Continued)

*Primary Examiner* — Matthew S Smith
*Assistant Examiner* — Quovaunda Jefferson
(74) *Attorney, Agent, or Firm* — Harness, Dickey & Pierce, P.L.C.

(57) ABSTRACT

In a method for producing a thin film chip including an integrated circuit, a semi-conductor wafer having a first surface is provided. At least one cavity is produced under a defined section of the first surface by means of porous silicon. A circuit structure is produced in the defined section. The defined wafer section is subsequently released from the semi-conductor wafer by severing local web-like connections, which hold the wafer section above the cavity and on the remaining semiconductor wafer.

19 Claims, 4 Drawing Sheets

U.S. PATENT DOCUMENTS

| | | | |
|---|---|---|---|
| 2002/0153595 A1* | 10/2002 | Tayanaka | 257/655 |
| 2005/0029224 A1 | 2/2005 | Aspar et al. | |
| 2005/0104223 A1 | 5/2005 | Huang et al. | |

FOREIGN PATENT DOCUMENTS

| | | |
|---|---|---|
| JP | 2002-299500 | 10/2002 |
| WO | 2005/104223 A1 | 11/2005 |

OTHER PUBLICATIONS

T. Overstolz et al.; "A Clean Wafer-Scale Chip-Release Process Without Dicing Based on Vapor Phase Etching"; Jan. 2004; pp. 717-720.

Takao Yonehara et al.; "ELTRAN® Novel SOI Wafer Technology"; Jul. 2001; pp. 10-16.

Camille Darnaud-Dufour et al.; "Canon ELTRAN What's SOI"; Feb. 2006; 3 pages.

S. Armbruster et al.; "Surface Micromachining of Monocrystalline Silicon Membranes Using a Silicon Micro Grid on Sintered Porous Silicon"; Sep. 2004; pp. 22-23.

C. Berge et al.; "150-mm layer transfer for monocrystalline silicon solar cells"; 2006; pp. 3102-3107.

* cited by examiner

METHOD FOR PRODUCING A THIN SEMICONDUCTOR CHIP COMPRISING AN INTEGRATED CIRCUIT

CROSS REFERENCE TO RELATED APPLICATIONS

This application is a continuation of international patent application PCT/EP2007/001886, filed on Mar. 6, 2007 designating the U.S., which international patent application has been published in German language as WO 2007/104443 A1 and claims priority from German patent applications DE 10 2006 013 419 filed on Mar. 14, 2006 and DE 10 2006 059 394.4 filed on Dec. 8, 2006. The entire contents of these prior applications are incorporated herein by reference.

BACKGROUND OF THE INVENTION

The present invention relates to a method for producing an integrated circuit, and more particularly to a method for producing very thin semiconductor chips comprising an integrated circuit. Chips according to the invention may have a thickness of significantly less than 100 µm, advantageously they have a thickness of approximately 50 µm or less, and even more preferably a thickness of approximately 20 µm. Such thin chips are well suited for producing so-called 3D chips in which a plurality of thin chips each comprising an integrated circuit are stacked one on top of another. Furthermore, such thin chips have a certain flexibility as a result of the small material thickness, such that they can be used on flexible carrier materials, such as for example a plastic film.

One possible approach for producing such thin chips comprising an integrated circuit may involve producing the integrated circuit on a semiconductor wafer having a thickness of for example 500 µm up to 800 µm. After the integrated circuit has been produced, the rear side of the semiconductor wafer is eroded by a mechanical and/or chemical process. The semiconductor wafer, which typically carries a plurality of integrated circuits, then has to be divided in order to form the chips. This is conventionally done by sawing, separation by grinding, cutting or scribing and breaking. One method for dividing semiconductor wafers to form chips is described in DE 40 29 973 A1.

This approach has the disadvantage that a considerable part of the wafer material is lost as a result of the erosion. Furthermore, it is necessary to provide relatively large distances between the individual chips on a wafer in order that there is enough space available for sawing, separation by grinding, etc. Typical distances are in this case of an order of magnitude of 150 µm. All this has a disadvantageous effect on the costs for the production of thin integrated circuits, i.e chips having material thicknesses of less than 150 µm.

WO 2005/104223 A1 describes a method wherein a plurality of vertical trenches are produced at the first surface of the semiconductor wafer by means of an anisotropic etching process. Afterward, the opened first surface is closed off again by means of an epitaxial layer and the semiconductor wafer is subjected to a thermal treatment (annealing). The intention is here to form individual closed channels below the first surface. Vertical entrances to the concealed channels are then produced in a further anisotropic etching process. The inner walls of the channels and of the vertical entrances are subsequently provided with an oxide layer by means of an oxidation process. The channels and vertical entrances surround a wafer section at the first surface, in which section a circuit structure is then produced in a conventional manner. Afterward, the oxide layer is removed in the channels and vertical entrances by means of a further etching process, such that the wafer section is connected to the rest of the wafer only via web-like connections on its underside. These connections are broken by tearing out the wafer section upward from the remaining semiconductor wafer, wherein a torsional movement is also proposed. This method is intended to enable the production of chips having a thickness of less than 10 µm.

In this known method, producing the deeply situated oxide layers below the wafer section and selectively etching them out later seem very complicated and difficult. Moreover, this method has the disadvantage that the formation of the web-like connections is highly dependent on individual process parameters which can vary in manifold ways. Therefore, the formation of web-like connections having exactly defined properties is extremely difficult, if not impossible. If the web-like connections turn out to be too thick, there is a considerable risk of the chip being damaged in the course of being released. If they turn out to be too thin, the necessary stability for the production of the circuit structure is lacking. The reproducibility of the web-like connections and the process reliability can therefore be ensured only with very high outlay, if at all.

A paper by Overstolz et al. entitled "A Clean Wafer-Scale Chip-Release Process without Dicing Based on Vapor Phase Etching", $17^{th}$ IEEE International Conference on Micro Electro Mechanical Systems, January 2004, pages 717 to 720, discloses releasing a micromechanical sensor, namely an inclinometer, from a silicon material solely by means of various etching processes. In this case, an SOI wafer (Silicon on Insulator) serves as the starting material. In order to release the inclination sensor, trenches and holes are etched both from the front side and from the rear side of the wafer material. In addition, the oxide layer lying in the semiconductor material is partially etched out by introducing hydrofluoric acid vapour through the holes at the front side and rear side into the interior of the semiconductor wafer.

U.S. Pat. No. 6,165,813 describes a method for releasing thin chips fixed to a flexible substrate by bending the substrate. U.S. Pat. No. 6,521,068 describes a method for separating chips from a substrate, wherein a region below the chip is heated by a laser.

JP 2002-299500 describes the removal of chips by means of a so-called dummy substrate.

Finally, production and use of porous silicon is known in the art. DE 197 52 208 A1 discloses a method for producing a membrane sensor, wherein a thin layer of silicon carbide or silicon nitrite is deposited over a region of porous silicon. The porous silicon is subsequently removed as sacrificial material using ammonia. As a result, a cavity arises below the membrane layer of silicon carbide or silicon nitrite, which cavity thermally decouples the sensor membrane from the remaining substrate.

A method for producing a piezoresistive pressure sensor with a freely suspended membrane composed of monocrystalline silicon is described in a publication by Armbruster et al., "Surface Micromachining of Monocrystalline Silicon Membranes Using a Silicon Micro Grid of Sintered Porous Silicon", Technical Digest of Eurosensors XVIII, Rome, Sep. 12 to 15, 2004, pages 22/23. In this method, in a first step a p-doped silicon substrate is provided with shallow n-doped regions and with deep $n^+$-doped regions. The shallow n-doped regions form a lattice structure at the surface of the p-doped silicon substrate. The p-doped silicon substrate below the lattice structure is subsequently converted into porous silicon. For this purpose, the regions of the p-doped substrate below the n-doped lattice regions are undercut in concentrated hydrofluoric acid. A subsequent sintering process has the effect that the sintered porous silicon forms a cavity below the lattice structure. An epitaxial layer is subsequently applied above the lattice structure, said epitaxial layer forming the sensor membrane of the pressure sensor. The cavity formed by means of the porous silicon is closed off again in this way.

Furthermore, porous silicon is used in the so-called ELTRAN process (Epitaxial Layer TRANsfer), which can be used to produce SOI wafers. The procedure is described in a publication by T. Yonehara and K. Sakaguchi that appeared in JSAP International No. 4, July 2001, entitled "ELTRAN; Novel SOI-Wafer Technology".

SUMMARY OF THE INVENTION

Against this background, it is an object of the present invention to provide an alternative method for producing thin integrated circuit chips in a cost-effective manner.

It is another object of the invention to provide a method for producing thin integrated circuit chips with high quality and yield.

It is additionally an additional object of the invention to provide an integrated circuit which can be produced simply and cost-effectively by such a method.

In accordance with one aspect of the invention, there is provided a method for producing a thin semiconductor chip comprising an integrated circuit, the method comprising the steps of providing a semiconductor wafer having a first and a second surface, the semiconductor wafer being composed of p-doped silicon in the region of the first surface, defining at least one wafer section in the region of the first surface, converting the p-doped silicon in the region of the defined wafer section into porous silicon having a plurality of pores by means of an anodic etching process, the porous silicon comprising an upper layer at the first surface and a lower layer below the upper layer, producing a wafer cavity below the at least one defined wafer section by thermally treating the porous silicon such that the pores of the upper layer are substantially closed by material from the lower layer, producing a circuit structure in the at least one defined wafer section, and releasing the defined wafer section from the semiconductor wafer, wherein the wafer section is freed in a first process sequence such that it is held only via web-like connections on the remaining semiconductor wafer, and wherein the web-like connections are severed in a second process sequence.

There is also provided an integrated circuit chip comprising a circuit structure formed in a semiconductor material having at least a first material layer and a second material layer, wherein the first and the second material layers are arranged one above another, wherein the circuit structure is essentially formed in the first material layer, and wherein residues of severed web-like connections are arranged in the region of the second material layer, wherein the second material layer contains p-doped porous silicon which has been subjected to a thermal treatment.

Preferably, a plurality of wafer cavities are produced in the region of the first surface of the semiconductor wafer, wherein the individual wafer cavities are separated from one another by lateral walls. Accordingly, a plurality of wafer sections are formed, with a respective wafer cavity situated below each of said wafer sections. A circuit structure is preferably produced in each defined wafer section, such that a plurality of thin chips having identical or different circuit structures can be produced in a common process cycle.

The new approach has the advantage that the individual wafer cavities can be produced with a very high reproducibility and process reliability, which enables a high yield in the production of thin chips. Furthermore, the web-like connections which hold the individual defined wafer sections prior to severing can be dimensioned and positioned very exactly. This applies both to web-like connections at the lateral periphery of the wafer sections and to web-like connections below the defined wafer sections. The latter support the otherwise freed wafer section in a pillar-like fashion downward on the remaining semiconductor wafer, as is known in principle from WO 2005/104223 A1 cited in the background portion. In contrast to the procedure described therein, the invention makes it possible to create deeply situated, vertical web-like connections within the wafer cavity in a very simple manner and with a high reproducibility, as is described below on the basis of a preferred exemplary embodiment. Furthermore, vertical, lateral and both variants of web-like connections can be produced using the same technology and in a common process sequence, such that the new method is significantly more flexible with regard to the suspension of the future chips. The "suspension" of the future chips can therefore be optimized better with regard to the subsequent process steps by arranging web-like connections having relatively exactly defined dimensions optionally at the lateral periphery and/or below the defined wafer sections. It is thus possible to optimize the stability of the wafer and the fracture behaviour of the chips in the releasing process.

In summary, the new method therefore enables a well-controllable, cost-effective and high-quality production of thin integrated circuits.

In a refinement, the wafer cavity below the defined wafer section is produced as a closed wafer cavity.

In this refinement, the wafer cavity is closed off towards the outside and consequently concealed in the semiconductor wafer. There are no deliberate entrances from outside into the cavity. Such a cavity has the advantage that the semiconductor wafer can be stored in stock despite the cavities, whereby the production process can be better rationalized and made even more cost-effective.

It is particularly preferred if the wafer cavity is formed as a closed cavity during the entire production process, because this precludes the ingress of contaminants into the cavity. This preferred refinement can be realized well by means of the porous silicon since the formation of pores during the anodic etching process can be varied depending on the anode current and the action time. In other words, the wafer cavity is in this case always covered by porous semiconductor material. Although the porous semiconductor material has pores, these pores represent spatially very narrow openings which are spread widely over a relatively large area relative to the pore size. Therefore, a substantially closed cover is situated above the cavity. This refinement leads to a very uniform surface above the cavities, such that the semiconductor material available for producing the circuit structures is of higher quality. Therefore, this refinement enables a further increase in the yield.

In a further refinement, the porous silicon has an area extent corresponding to the area extent of the defined wafer section.

In this refinement, a wafer cavity is produced below the defined wafer section which is extended laterally to such an extent that the defined wafer section "floats" above the rest of the semiconductor wafer. The lateral area extents of the cavity and the wafer section are substantially identical. As an alternative to this, wafer cavities could also be produced whose area extent laterally is significantly greater than that of the defined wafer sections. The preferred refinement has by comparison a greater stability, which contributes to the further increase in the yield.

In a further refinement, a plurality of local n-doped regions are produced in the p-doped silicon of the semiconductor wafer before the p-doped silicon is converted into porous silicon by means of the anodic etching process.

This refinement is particularly preferred because n-doped regions are not attacked in the course of the anodic etching process. Therefore, the dimensions of the wafer cavities and the position and the dimensions of the web-like connections can be set very exactly in this refinement.

In a further refinement, a first group of strip-like n-doped regions are produced, which form at the first surface an n-doped lattice structure with enclosed p-doped facets. Preferably, the p-doped facets have a lateral area extent corresponding to the area extent of the defined wafer sections, i.e. the p-doped facets form the defined wafer sections for taking up the circuit structures.

The size of the concealed wafer cavities can be set very exactly with these refinements because the strip-like regions act as partitions between the cavities. Furthermore, the lateral distance between the wafer sections can be set by means of such strip-like n-type regions, such that the available wafer surface can be optimally subdivided in order to obtain an efficient utilization of area. Wider strip-like regions allow to increase for example the stability of the wafer surface despite the concealed cavities. Narrower regions enable a particularly efficient utilization of area. Since n-doped regions can be formed very exactly by means of known masking methods, this refinement enables a very exact subdivision of the wafer.

In a further refinement, a second group of small spot-like n-doped regions are produced, wherein at least one spot-like n-doped region is arranged in the region of the defined wafer section. Preferably, at least one spot-like n-doped region is arranged in each facet.

This refinement makes it possible to form very exact web-like connections on the underside of the defined wafer sections. Such vertical webs on the underside prevent or at least reduce a significant flexure of the material above the cavity. Therefore, this refinement enables a very flexible implementation of the process sequence and also a stable suspension of the wafer sections during the production of the circuit structures.

In a further refinement, at least one ring-shaped n-doped region is produced, which is preferably arranged concentrically with respect to the semiconductor wafer, wherein the spot-like n-doped regions are distributed substantially uniformly within the ring-shaped n-doped region.

This refinement makes it possible to prepare vertical web-like connections on the entire surface of the semiconductor wafer without implementing fixed facets or subdivisions. The user is thus afforded the possibility of individually determining the chip area of the future chips, since the entire surface of the wafer which lies within the ring-shaped n-doped region can be suspended freely. Therefore, even chips having different chip areas can be produced individually on a wafer.

In a further refinement, after the thermal treatment, an epitaxial layer is applied to the porous silicon, wherein the circuit structure is produced at least predominantly in the epitaxial layer. Preferably, the circuit structure is arranged completely in the epitaxial layer.

In the preferred refinements of the invention, the epitaxial layer is produced over the whole area on the entire surface of the semiconductor wafer, thus resulting in a semiconductor wafer which has concealed cavities, on the one hand, and a very uniform, preferably monocrystalline surface, on the other hand. Such a surface is advantageous because it facilitates a substantially fault-free production of the circuit structures with a high yield. Any defect in the semiconductor material at the surface of the wafer involves the risk of process faults that impair the yield. In the preferred refinements of the invention, the epitaxial layer is produced on a substantially planar surface, which constitutes a significant advantage over the method from WO 2005/104223 A1.

In a further refinement, after the circuit structure has been produced, the defined wafer section is freed in such a way that web-like connections arise at a lateral periphery of the wafer section. Preferably, the defined wafer section is defined by etching trenches into the depth of the wafer at the sides of the wafer section, preferably by means of an anisotropic etching process.

Lateral web-like connections have the advantage that the defined wafer section can easily be broken out from the remaining semiconductor wafer by means of shear forces. In this case, the risk of damage to the circuit structure in the defined wafer section is comparatively low. Furthermore, through the choice of the lateral distance between the web-like connections and the area regions in which the circuit structures are produced, a freely selectable "safety margin" can be established, which contributes in a simple manner to further increasing the yield. Moreover, lateral web-like connections shift the breakpoints to the lateral periphery of the chips, such that the chip undersides can be formed largely uniformly, which is advantageous for stacking thin chips.

In a further refinement, the wafer section is arranged in the [100] direction or in the [110] direction in the semiconductor wafer, and the web-like connections are arranged at the corners or at lateral edges of the wafer section.

This refinement is preferred because the breaking behaviour of semi-conductor wafers differs depending on the position of a fracture edge relative to the crystal lattice. This refinement makes it possible to minimize the forces required for severing lateral web-like connections, whereby the risk of undesired damage is further minimized.

In a further refinement, the p-doped silicon, in the region of the defined wafer section, is converted into an upper layer composed of porous silicon having a plurality of finer pores and into a lower layer having a plurality of larger pores by means of the anodic etching process.

The penetration depth and pore size of the layers can be varied during the production of the porous regions by for example varying the current density of that current which flows through a hydrofluoric acid solution to the semiconductor wafer used as anode. By producing a large-pored lower layer (situated more deeply) and a fine-pored upper layer (situated at a higher level), it is possible to form a concealed wafer cavity without the top side of the semiconductor wafer having to be completely opened. This is advantageous because a higher material quality can thus be produced at the surface of the semiconductor wafer. Consequently, yield can be further increased.

In a further refinement, a semiconductor wafer is provided which has at the first surface a top layer and an underlying lower or bottom layer, wherein the top layer is a more heavily p-doped silicon than the lower layer. The porous silicon is advantageously formed in the more heavily p-doped top layer, whereas the more weakly p-doped lower layer serves only as supporting substrate material.

The refinement is advantageous because material stresses that inevitably arise as a result of the formation of the wafer cavity or wafer cavities can be compensated for by means of the different dopings. Fracture damage on account of such material stresses can be avoided by means of the different dopings.

In a further refinement, after the defined wafer section has been released, the remaining semiconductor wafer is ground and provided as semiconductor wafer for the production of further integrated circuits.

This refinement is particularly advantageous because it enables an efficient utilization of the semiconductor material. Therefore, this refinement leads to a particularly cost-effective production of thin chips comprising integrated circuits.

It goes without saying that the features mentioned above and those yet to be explained below can be used not only in the combination respectively specified, but also in other combinations or by themselves, without departing from the scope of the present invention.

BRIEF DESCRIPTION OF THE DRAWINGS

Exemplary embodiments of the invention are illustrated in the drawing and are explained in more detail in the description below. In the figures.

DESCRIPTION OF PREFERRED EMBODIMENTS

Figure 1:
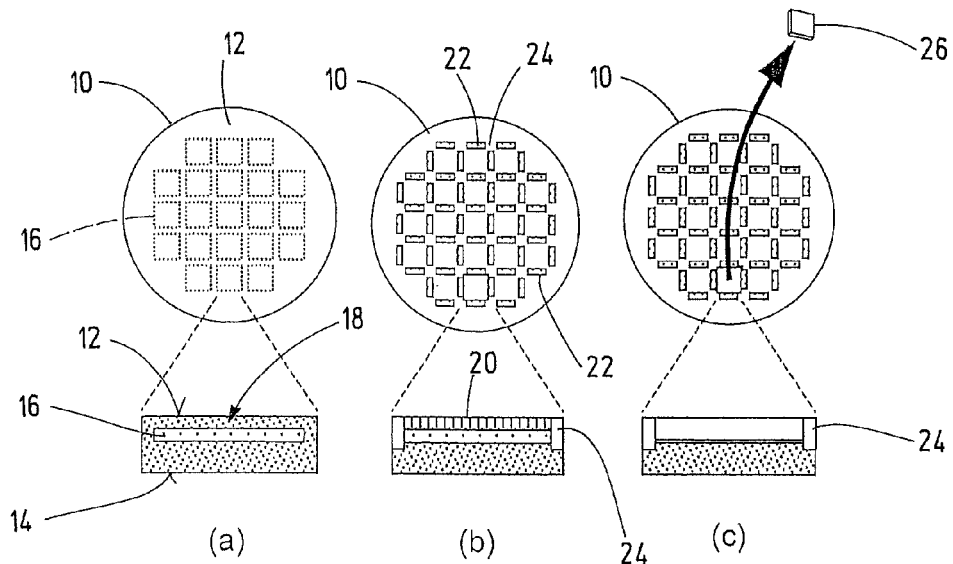
FIG. 1 shows a simplified illustration for explaining a preferred exemplary embodiment of the method according to the present invention.

In FIG. 1, a semiconductor wafer is designated by reference numeral 10. The semiconductor wafer 10 has a first surface 12 and an opposite second (lower) surface 14. A cavity 16 is arranged below the first surface 12, such that a wafer section 18 is supported in "suspended" fashion above the cavity. As is illustrated in FIG. 1a), the semiconductor wafer has a plurality of such cavities 16 which are concealed within the semiconductor material.

In a first exemplary embodiment of the invention, such a semiconductor wafer 10 is provided (FIG. 1a). Afterward, a respective circuit structure is produced in a conventional manner in the wafer sections 18 above the cavities 16. The circuit structure is illustrated schematically with the reference numeral 20 in FIG. 1b. In preferred exemplary embodiments, it lies in the [100] or [110] direction relative to the crystal lattice of the wafer material. The wafer section 18 with the circuit structure 20 forms a future chip comprising an integrated circuit, which then has to be released from the semiconductor wafer 10.

In the exemplary embodiment shown, this is done by a plurality of trenches 22 being etched into the surface 12 of the semiconductor wafer 10, wherein the individual trenches 22 are separated from one another by web-like regions 24. In the preferred exemplary embodiment, the trenches 22 are distributed in lattice-like fashion on the surface 12 of the semiconductor wafer 10 and they form a pattern of vertical and horizontal trenches. Where a vertical and a horizontal trench 22 meet, a web-like region 24 that was not etched out has remained. Four trenches in each case surround a wafer section 18 with the integrated circuit structure 20. Accordingly, here each wafer section 18 is held by the web-like connections 24 at its four corners only. As an alternative, the wafer sections 18 could also be held via web-like connections which are not arranged at the corners but for example centrally at the lateral edges of each wafer section 18. In addition to the web-like connections 24 at the lateral periphery of the individual wafer sections 18, it is also possible to provide web-like connections on the underside of the individual wafer sections, as is described below with reference to FIGS. 2, 5 and 6. The new method makes it possible to arrange web-like connections optionally only below the defined wafer sections 18, only at the lateral periphery thereof or in combined fashion both at the bottom and at the lateral periphery.

As is illustrated in FIG. 1c, the individual wafer sections 18 can be broken out from the lattice grid of the trenches 22, and chips 26 comprising an integrated semiconductor structure are obtained in this way.

Figure 2:
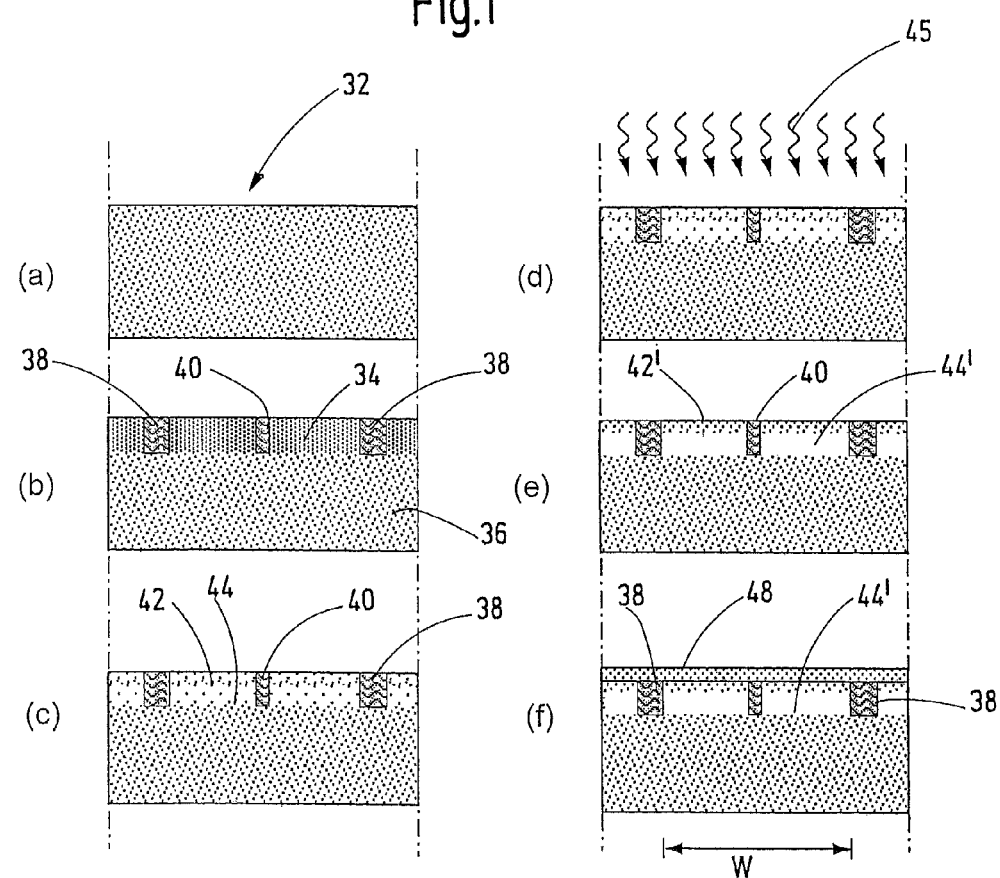
FIG. 2 shows a simplified illustration for explaining the process sequence which is used to produce the wafer cavity below a defined wafer section.

FIG. 2 shows a preferred exemplary embodiment for producing a semi-conductor wafer 10 according to FIG. 1. In accordance with FIG. 2, firstly a semiconductor wafer 32 composed of monocrystalline, weakly p-doped silicon is provided. In accordance with FIG. 2b, the semiconductor wafer 32 is provided with an upper layer 34 composed of more heavily p-doped silicon at its top side. In preferred exemplary embodiments, this is done by providing the top side of the semiconductor wafer 32 with further doping atoms in a known manner, wherein the doping may be approximately $10^{18}$ in this case. The semiconductor wafer 32 now has an upper layer 34 having a higher p-type doping and a lower layer 36 having a weaker p-type doping. In addition, n-doped regions 38, 40 are formed in the upper layer 34. Preferably, $n^+$-doped regions are involved here, i.e the regions 38, 40 are provided with a high concentration of n-type doping atoms. The regions 38, 40 can be formed by known methods, such as for example ion implantation or some other method using conventional mask technology.

In accordance with FIG. 2c, porous layers 42, 44 are subsequently produced in the heavily p-doped layer 34. For this purpose, in a preferred exemplary embodiment, the semiconductor wafer 32 is passed as anode into a solution composed of hydrofluoric acid and alcohol, such that a current can flow through the solution to the semiconductor wafer. As a result of this, porous silicon forms in the region of the upper layer 34, wherein the pore size can be altered by varying the current density. In the preferred exemplary embodiment, a fine-pored layer 42 is produced at the surface of the semiconductor wafer and a large-pored layer 44 is produced underneath. A more detailed description of the production of these layers is contained in the publication by Yonehara/Sakaguchi mentioned in the introduction, which is incorporated by reference here with regard to the production of porous silicon layers.

In accordance with FIG. 2d, the wafer with the porous layers 42, 44 is then subjected to a thermal treatment 45, for example at approximately 1100° C. The consequence of this is that the pores in the upper fine-pored layer 42 at least substantially close again, such that the upper layer 42 is transformed again into a substantially uniform, monocrystalline layer 42'. Lying underneath that is the layer 44', the pore size of which has increased to such a great extent that it is hardly possible for it still to be able to be called a material layer. The large-pored layer 44' then forms the cavity, which is designated by reference numeral 16 in FIG. 1. Isolated webs (not illustrated here) connecting the upper layer 42' to the substrate material situated at the bottom may have remained within said cavity. Such webs may be the consequence of process fluctuations and practical limitations when producing the cavity 16. Furthermore, vertical connecting webs can be produced in a targeted manner by means of the n-doped regions 40, as will be explained in more detail further below on the basis of a practical example with reference to FIGS. 5 and 6.

In accordance with FIG. 2f, the next step involves applying a further layer 48 as a cover layer to the surface of the layer 42'. In a preferred exemplary embodiment, this involves a monocrystalline epitaxial layer having a doping adapted for the future circuit component, which epitaxial layer is grown on the entire surface of the wafer including the layer 42'. The doping can be either of the n-type or of the p-type. This results in a semiconductor wafer 10 that is provided as starting material for the process steps in accordance with FIG. 1.

As can be seen from FIG. 2f, the cavity 44' extends between the laterally situated n-doped regions 38, which substantially form lateral boundaries of the cavity 44'. The lateral area extent of the cavity 44' is designated here by W. In the preferred exemplary embodiments, cavity 44' has a rectangular and preferably at least substantially square base area, as is illustrated in FIGS. 1a to 1c. Accordingly, the lateral area extent of the cavity 44' into the depth of the viewing direction is likewise W.

Figure 3:
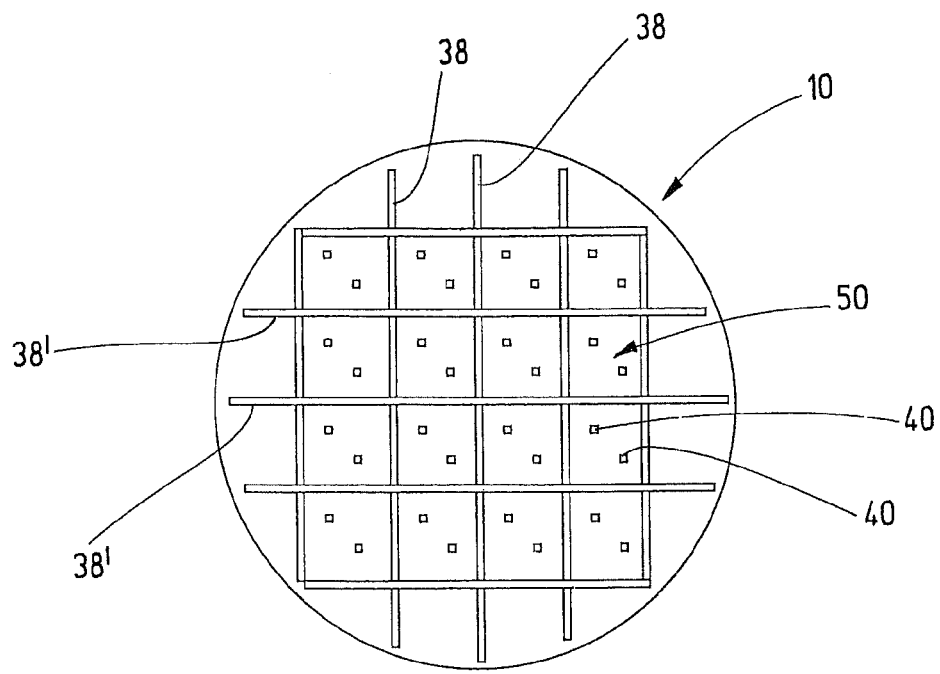
FIG. 3 shows a schematic plan view of a semiconductor wafer that is processed by means of the method according to the present invention.

As can be seen from FIG. 3, the n-doped regions 38 run in strip-like fashion over the entire wafer 10. In this case, the wafer 10 has a first group of strip-like n-doped regions 38 and a second group of n-doped strip-like regions 38', which in each case run orthogonally with respect to one another, such that the strip-like regions 38, 38' form facets 50. The lateral area extent of each facet 50 corresponds to the cavity 44' below the surface of the wafer 10. Small spot-like n-doped regions 40 may (but need not) be arranged within the cavities, and may serve as spot-like vertical supporting connections for the freely suspended wafer section after the formation of the cavity 44'.

As can be seen from the joint consideration of FIGS. 1 and 2, the lateral area extent W of cavity 16 corresponds approximately to the lateral area extent of the wafer section 18 in which the circuit structure 22 is produced. The lateral area extent of the porous layers 42, 44 therefore also determines the chip area of the later chip 26. In other words, the lateral area extent of the porous layers 42, 44 is approximately equal to the area of the future chips.

Figure 4:
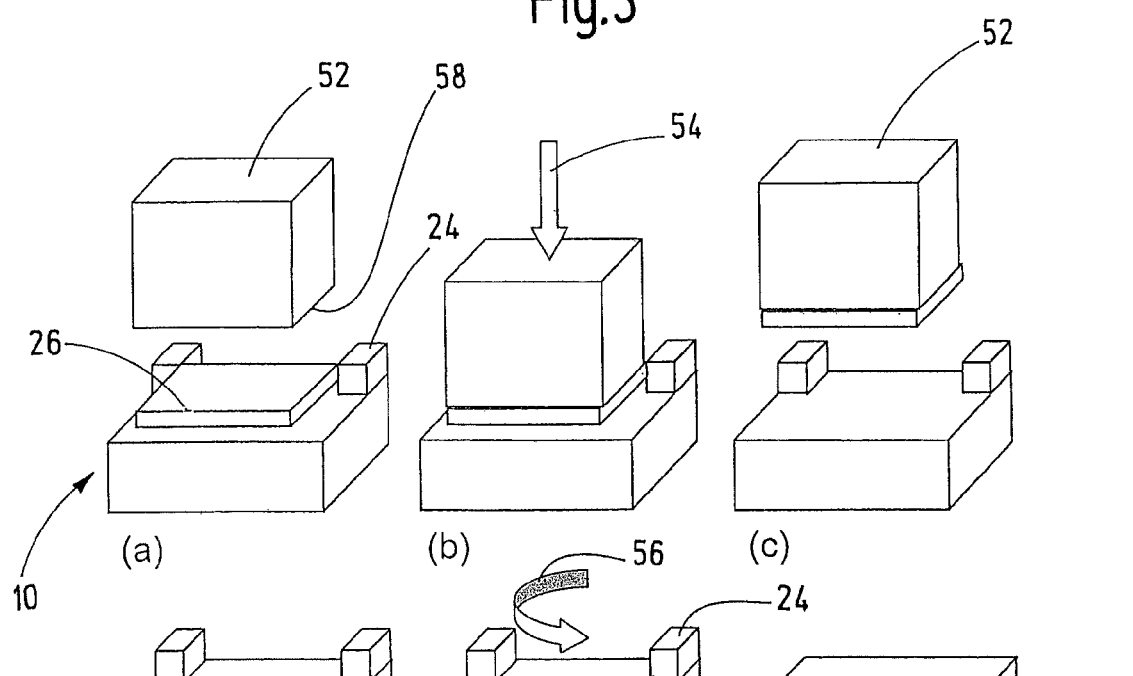
FIG. 4 shows a schematic illustration of the separation of the chips in a preferred variant of the method according to the present invention.

FIG. 4 shows a preferred exemplary embodiment for releasing the chips 26. In this case, the chips 26 are grasped by means of a gripping tool 52, which sucks up the chips 26 (more precisely: the wafer sections 18 which are still suspended on the web-like connections 24), by vacuum. Through pressure from above (arrow 54), the web-like connections 24 are broken by the individual chip 26 being pressed downward into the cavity. The chip 26 can subsequently be taken off upward by means of the gripping tool 52 and be processed further. Alternatively or in addition, the chip 26 may also be broken out from the wafer 10 by tensile forces and/or torsion forces. The gripping tool is preferably a pick-and-place tool such as is used for the handling of SMD components.

The advantages of the method illustrated in FIGS. 1 and 2 include the fact that the remaining semiconductor wafer 10 can be recycled after all the chips 26 have been removed. For this purpose, the semiconductor wafer 10 with the residual web regions 24 (FIG. 4d) is ground and polished on its top side, which is symbolically illustrated at reference numeral 56 in FIG. 4e. This results in a (somewhat thinner) semiconductor wafer 32, which can be used again in the process sequence of FIG. 2.

As is illustrated in FIG. 4, the gripping tool 52 grips the individual chips 26 substantially congruently. Accordingly, the gripping tool 52, in the region of its lower gripping area 58, is made approximately just as large as the lateral area extent of the chip 26. As a result, the gripping tool 52 can securely hold the sensitive chips 26. The risk of damage in the course of breaking out from the semiconductor wafer 10 is minimized further.

Figure 5:
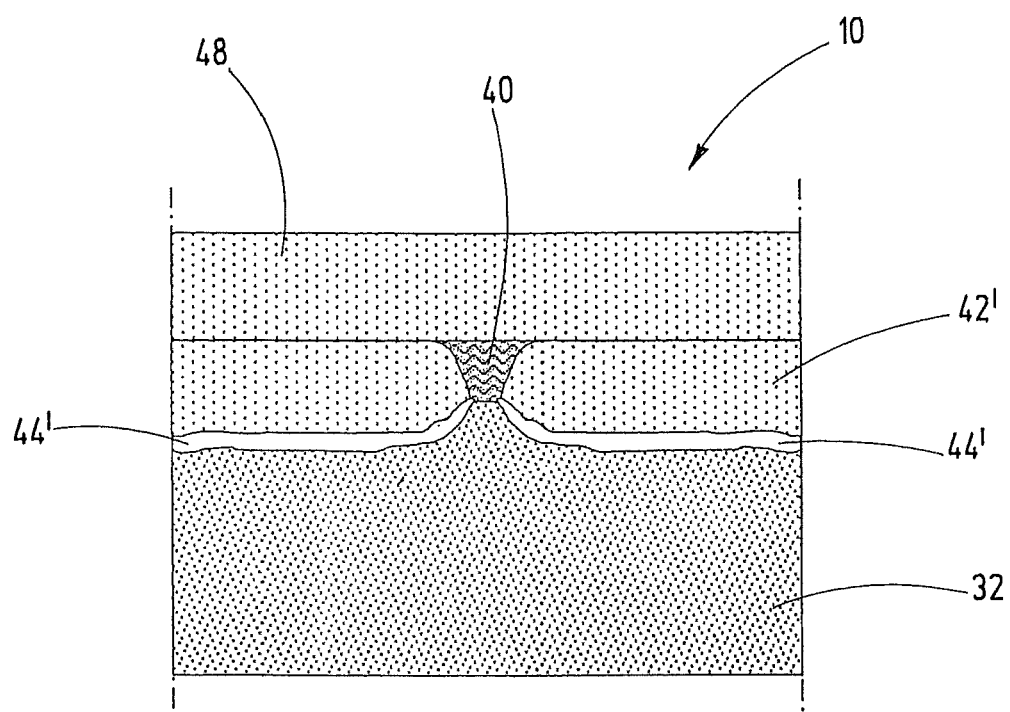
FIG. 5 shows an excerpt from the semiconductor wafer from FIG. 3 in a lateral cross section.

FIG. 5 illustrates a partial excerpt from the wafer 10 in a lateral sectional view. The illustration of FIG. 5 was copied from an electron microscope recording of a correspondingly cut-away wafer 10 since the recording itself cannot be reproduced with sufficient quality. To observe the proprieties, however, it should be pointed out that the illustration in FIG. 5 is not exactly true to scale. Identical reference symbols designate the same elements as before.

As can be seen in FIG. 5, concealed cavities 44' that form a relatively sharp separation between the overlying layer 42' and the underlying substrate material 32 can be produced by means of the procedure described. Since the n-doped regions, here the region 40, are not attacked in the anodic etching process, the cavities 44' end at such an n-doped region. If the n-doped region has a local point-type extent, in this way a local web-like anchoring point arises via which the epitaxial layer 48 is supported on the supporting substrate material 32.

If, by contrast, the n-doped regions run in strip-like fashion through the semiconductor wafer 10, lateral boundary walls arise which separate adjacent cavities 44' from one another and accordingly form facets such as are illustrated in FIG. 3.

Figure 6:
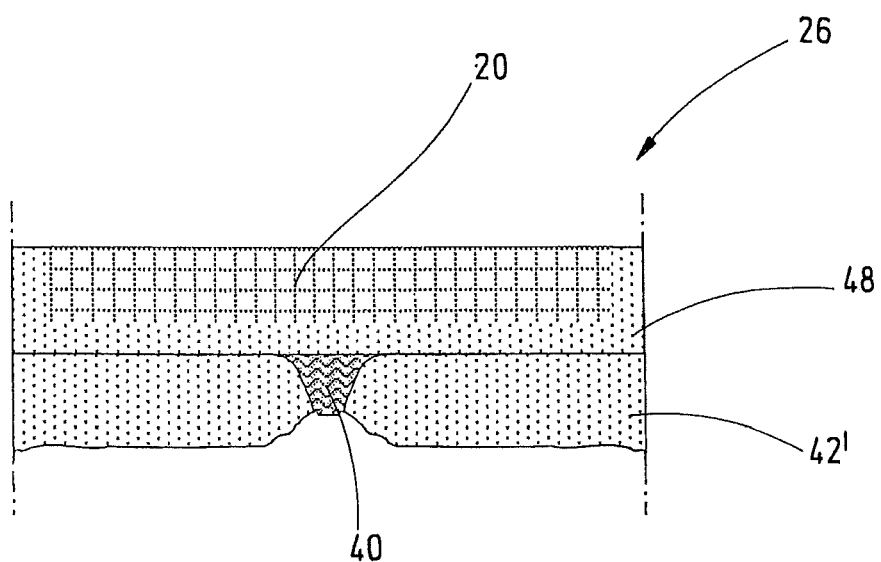
FIG. 6 shows a part of a separated chip comprising an integrated circuit in a lateral cross section similar to that in FIG. 5.

FIG. 6 shows a partial excerpt from a chip 26 comprising an integrated circuit structure 20, which chip was produced according to the new method. As can be seen in comparison with FIG. 5, the chip 26 was separated from the underlying substrate material 32 by breaking the local web-like connection 40. The chip 26 consequently has a first, upper material layer, which is essentially formed by the epitaxial layer 48. In the preferred exemplary embodiments, the circuit structure 20 is implemented in this material layer. Arranged underneath is a second, lower material layer 42', which is essentially formed by the earlier fine-pored layer 42 as was substantially closed off again by material enrichment. On the underside of the layer 42' there is a certain undulation or roughness, which is produced primarily at the breaking points in the region of the n-doped regions 38, 40.

Figure 7:
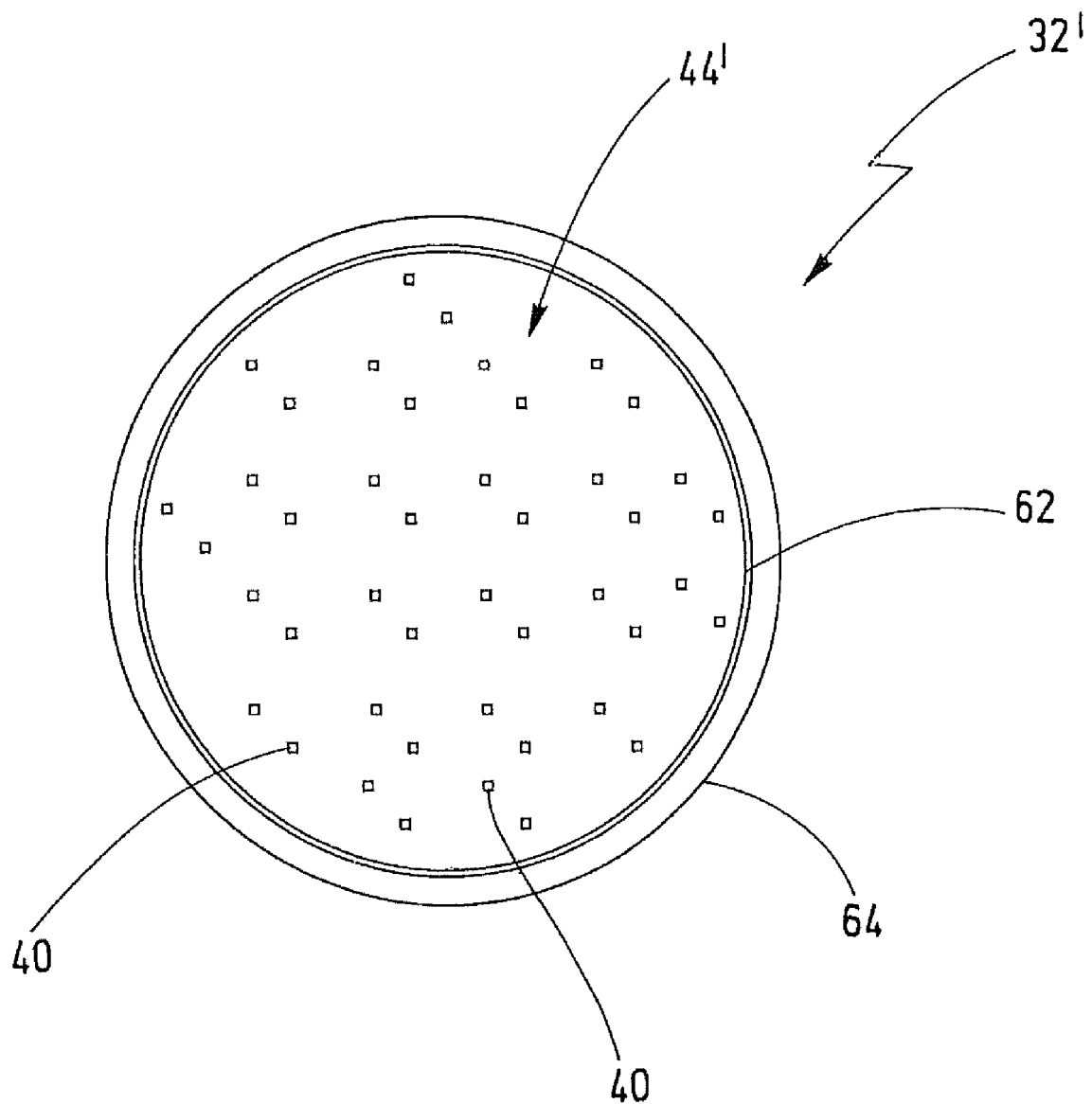
FIG. 7 shows a schematic plan view of a semiconductor wafer similar to that from FIG. 3, wherein a large cavity is provided within a ring-shaped boundary wall.

FIG. 7 shows the plan view of a semiconductor wafer 32' with a ring-shaped n-doped region 62, which is arranged approximately concentrically at the periphery 64 of the wafer. A plurality of local spot-like n-doped regions 40 are distributed substantially uniformly within the ring-shaped n-doped region 62. If the porous silicon is then produced in the case of this semiconductor wafer, a continuous, closed cavity arises which extends over a large part of the entire wafer area. Within said cavity, the spot-like n-doped regions 40 form vertical supporting points by which the porous layer 42' is supported downward. Such a wafer makes it possible for the user to configure the area extent of his chips 26 individually and variably. The semiconductor wafer 32' is therefore particularly well suited to stockkeeping. The user can then subdivide the individual chip areas by means of vertical trenches 22 such as are shown in FIG. 1. On account of the vertical supporting points at the spot-like n-doped regions 40, lateral web-like connections 24 can also be dispensed with in this case. However, lateral web-like connections 24 can also additionally be left when etching the trenches 22 in order to obtain an even stabler suspension of the chip area.

What is claimed is:

1. A method for producing a thin semiconductor chip comprising an integrated circuit, the method comprising the steps of:
   providing a semiconductor wafer having a first and a second surface, the semiconductor wafer being composed of p-doped silicon in the region of the first surface,
   defining at least one wafer section in the region of the first surface,
   converting the p-doped silicon in the region of the defined wafer section into porous silicon having a plurality of pores by means of an anodic etching process, the porous silicon comprising an upper layer at the first surface and a lower layer below the upper layer,
   producing a wafer cavity below the at least one defined wafer section by thermally treating the porous silicon such that the pores of the upper layer are substantially closed by material from the lower layer,
   producing a circuit structure in the at least one defined wafer section, and
   releasing the defined wafer section from the semiconductor wafer,
   wherein the wafer section is freed in a first process sequence by etching trenches into the depth of the wafer such that it is held only via web connections arranged at the lateral periphery of the wafer section on the remaining semiconductor wafer,
   wherein the web connections are severed in a second process sequence, and
   wherein a plurality of local n-doped regions are produced in the p-doped silicon before the p-doped silicon is converted into porous silicon by means of the anodic etching process.

2. The method of claim 1, wherein the wafer cavity below the defined wafer section is produced as a closed wafer cavity.

3. The method of claim 1, wherein the cavity has a lateral area extent that substantially matches the defined wafer section.

4. The method of claim 1, wherein a first group of strip-like n-doped regions are produced, which strip-like regions form an n-doped lattice structure with enclosed p-doped facets at the first surface.

5. The method of claim 1, wherein a second group of spot-like n-doped regions are produced, wherein at least one spot-like n-doped region is arranged in the region of the defined wafer section.

6. The method of claim 5, wherein a ring-shaped n-doped region is produced, and wherein the spot-like n-doped regions are distributed substantially uniformly within the ring-shaped n-doped region.

7. The method of claim 6, wherein the ring-shaped n-doped region is arranged substantially concentrically with respect to the wafer.

8. The method of claim 1, wherein an epitaxial layer is applied to the first surface after thermally treating the porous silicon, and wherein the circuit structure is produced at least predominantly in the epitaxial layer.

9. The method of claim 1, wherein the defined wafer section is freed after the circuit structure has been produced.

10. The method of claim 1, wherein the wafer has a crystal lattice having a [100] direction and a [110] direction, wherein the defined wafer section is arranged parallel to the [100] direction or parallel to the [110] direction, and wherein the web local connections are arranged at corners or at lateral edges of the wafer section.

11. The method of claim 1, wherein the p-doped silicon is converted into the upper layer composed of porous silicon having a plurality of finer pores and into the lower layer having a plurality of larger pores by means of the anodic etching process.

12. The method of claim 1, wherein the semiconductor wafer at the first surface has a top layer at the first surface and a bottom layer remote from the first surface, wherein the top layer is composed of a more heavily p-doped silicon than the bottom layer.

13. The method of claim 1, wherein the semiconductor wafer is ground after the defined wafer section has been released in order to re-use the semiconductor wafer for the production of further integrated circuit chips.

14. The method of claim 1, wherein the second process sequence comprises breaking out the wafer section by means of shear forces.

15. A method for producing a thin semiconductor chip comprising an integrated circuit, the method comprising the steps of:
   providing a semiconductor wafer having a first and a second surface, the semi-conductor wafer being composed of p-doped silicon in the region of the first surface,
   defining at least one wafer section in the region of the first surface,
   converting the p-doped silicon in the region of the defined wafer section into porous silicon having a plurality of pores by means of an anodic etching process, the porous silicon comprising an upper layer at the first surface and a lower layer below the upper layer,
   producing a wafer cavity below the at least one defined wafer section by thermally treating the porous silicon such that the pores of the upper layer are substantially closed by material from the lower layer,
   producing a circuit structure in the at least one defined wafer section, and
   releasing the defined wafer section from the semiconductor wafer,
   wherein the wafer section is freed in a first process sequence such that it is held only via web connections on the remaining semiconductor wafer, and
   wherein the web connections are severed in a second process sequence,
   wherein a plurality of local n-doped regions are produced in the p-doped silicon before the p-doped silicon is converted into porous silicon by means of the anodic etching process.

16. The method of claim 15, wherein a first group of strip-like n-doped regions are produced, which strip-like regions form an n-doped lattice structure with enclosed p-doped facets at the first surface.

17. The method of claim 15, wherein a second group of spot-like n-doped regions are produced, wherein at least one spot-like n-doped region is arranged in the region of the defined wafer section.

18. The method of claim 17, wherein a ring-shaped n-doped region is produced, and wherein the spot-like n-doped regions are distributed substantially uniformly within the ring-shaped n-doped region.

19. The method of claim 18, wherein the ring-shaped n-doped region is arranged substantially concentrically with respect to the wafer.

* * * * *